(12) United States Patent
Yoon

(10) Patent No.: US 10,297,313 B2
(45) Date of Patent: May 21, 2019

(54) PHASE CHANGE MEMORY DEVICE CAPABLE OF CHANGING POSITION OF SELECTED CELL ADDRESS

(71) Applicant: SK hynix Inc., Icheon-si, Gyeonggi-do (KR)

(72) Inventor: Jung Hyuk Yoon, Anyang-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/670,823

(22) Filed: Aug. 7, 2017

(65) Prior Publication Data
US 2018/0144798 A1  May 24, 2018

(30) Foreign Application Priority Data
Nov. 23, 2016 (KR) .................... 10-2016-0156703

(51) Int. Cl.
  *G11C 11/00* (2006.01)
  *G11C 13/00* (2006.01)
  *G11C 11/56* (2006.01)
  *G11C 8/10* (2006.01)
  *G11C 8/12* (2006.01)
  *G11C 8/06* (2006.01)

(52) U.S. Cl.
  CPC ............ *G11C 13/0028* (2013.01); *G11C 8/10* (2013.01); *G11C 8/12* (2013.01); *G11C 11/5678* (2013.01); *G11C 13/004* (2013.01); *G11C 13/0004* (2013.01); *G11C 13/0023* (2013.01); *G11C 13/0026* (2013.01); *G11C 13/0069* (2013.01); *G11C 8/06* (2013.01)

(58) Field of Classification Search
  CPC .... G11C 13/0028; G11C 8/12; G11C 11/5678
  See application file for complete search history.

(56) References Cited

U.S. PATENT DOCUMENTS

| 7,466,584 | B1* | 12/2008 | Parkinson | ............... | G11C 8/10 |
| | | | | | 365/148 |
| 8,139,415 | B2* | 3/2012 | Kim | ........... | G11C 8/10 |
| | | | | | 365/185.05 |
| 2008/0279021 | A1* | 11/2008 | Han | ....................... | G11C 29/18 |
| | | | | | 365/201 |
| 2010/0097832 | A1* | 4/2010 | Mukai | ................... | G11C 7/18 |
| | | | | | 365/51 |

(Continued)

FOREIGN PATENT DOCUMENTS

KR   1020020004860 A   1/2002

*Primary Examiner* — Mushfique Siddique
(74) *Attorney, Agent, or Firm* — William Park & Associates Ltd.

(57) ABSTRACT

A phase change memory device may be provided. The phase change memory device may include a plurality of Mats, a row control block and a column control block. The row control block may be provided to each of the Mats to control word lines. The column control block may be provided to each of the Mats to control bit lines. When a near phase change memory cell adjacent to the row control block and the column control block is selected, the phase change memory cells located at different positions, which may be spaced apart from the near phase change memory cell, in the Mats except for a reference Mat may be selected.

12 Claims, 7 Drawing Sheets

(56) References Cited

U.S. PATENT DOCUMENTS

| | | | | |
|---|---|---|---|---|
| 2011/0205789 A1* | 8/2011 | Kim | ................ | G11C 7/18 |
| | | | | 365/163 |
| 2011/0242875 A1* | 10/2011 | Nagashima | ........ | G11C 13/0004 |
| | | | | 365/148 |
| 2014/0050004 A1* | 2/2014 | Mochida | ................ | G11C 29/76 |
| | | | | 365/63 |
| 2014/0050021 A1* | 2/2014 | Kim | ................ | G11C 7/00 |
| | | | | 365/163 |
| 2015/0124518 A1* | 5/2015 | Nagashima | ........ | G11C 13/0004 |
| | | | | 365/148 |
| 2015/0325289 A1* | 11/2015 | Castro | ................ | G11C 13/0004 |
| | | | | 365/148 |

\* cited by examiner

MAT1

MAT2

PHASE CHANGE MEMORY DEVICE CAPABLE OF CHANGING POSITION OF SELECTED CELL ADDRESS

CROSS-REFERENCES TO RELATED APPLICATION

The present application claims priority under 35 U.S.C. § 119(a) to Korean application number 10-2016-0156703, filed on Nov. 23, 2016, in the Korean Intellectual Property Office, which is incorporated herein by reference in its entirety.

BACKGROUND

1. Technical Field

Various embodiments may generally relate to a phase change memory device, and more particularly, to a phase change memory device and Mats.

2. Related Art

Generally, a semiconductor memory device consists of a plurality of memory cells and a circuit for controlling the memory cells. The semiconductor memory device consists of banks configured to control the memory cells by groups. The banks consists of a region where the memory cells are collected. The memory cells are classified into the banks to control the memory cells so that signal transmission characteristics of the semiconductor memory device is improved.

Further, the banks are classified into Mats. The semiconductor memory device consists of the banks and a circuit for controlling the Mats. The circuit simultaneously drives the banks and the Mats similarly to one memory bank and one memory Mat.

The Mats consist of a plurality of memory cells. The memory cells in the Mats are selectively controlled by a row control circuit and a column control circuit provided to each of the mats.

According to related arts, a current is concentrated on a near cell adjacent to the row control circuit and the column control circuit relatively compared to a remote cell far away from the row control circuit and the column control circuit. Particularly, the current concentration is generated in a cross point structure using a phase change material as a switching unit.

Further, when the Mats are simultaneously driven, the memory cells located at a same position are simultaneously selected. Thus, when the near cells are simultaneously selected, an excessive peak current is concentrated on the near cell of each of the Mats. An error in the near cell may cause fails in the Mats that may not be repaired.

SUMMARY

According to an embodiment, there may be provided a phase change memory device. The phase change memory device may include a plurality of Mats, a row control block and a column control block. Each of the Mats may include a plurality of word lines, a plurality of bit lines and phase change memory cells arranged at intersected points between the word lines and the bit lines. The phase change memory cell may include a selector including a phase change material. The row control block may be arranged in each of the Mats to control the word lines. The column control block may be arranged in each of the Mats to control the bit lines. When a near phase change memory cell adjacent to the row control block and the column control block is selected, the phase change memory cells located at different positions, which may be spaced apart from the near phase change memory cell, in the Mats except for a reference Mat may be selected.

According to an embodiment, there may be provided a phase change memory device. The phase change memory device may include a plurality of Mats, a row control block, a column control block and an address-changing unit. Each of the Mats may include a plurality of word lines, a plurality of bit lines and phase change memory cells arranged at intersected points between the word lines and the bit lines. The phase change memory cell may include a selector and a storage member including a phase change material. The row control block may be provided to each of the Mats. The row control block may include a row decoder configured to receive a row address to control the word lines. The column control block may be provided to each of the Mats. The column control block may include a column decoder configured to receive a column address to control the bit lines. The address-changing unit may be arranged at the row control block and the column control block in the Mats except for a reference Mat to change phases of the enabled row and column addresses.

DETAILED DESCRIPTION

Figure 1:
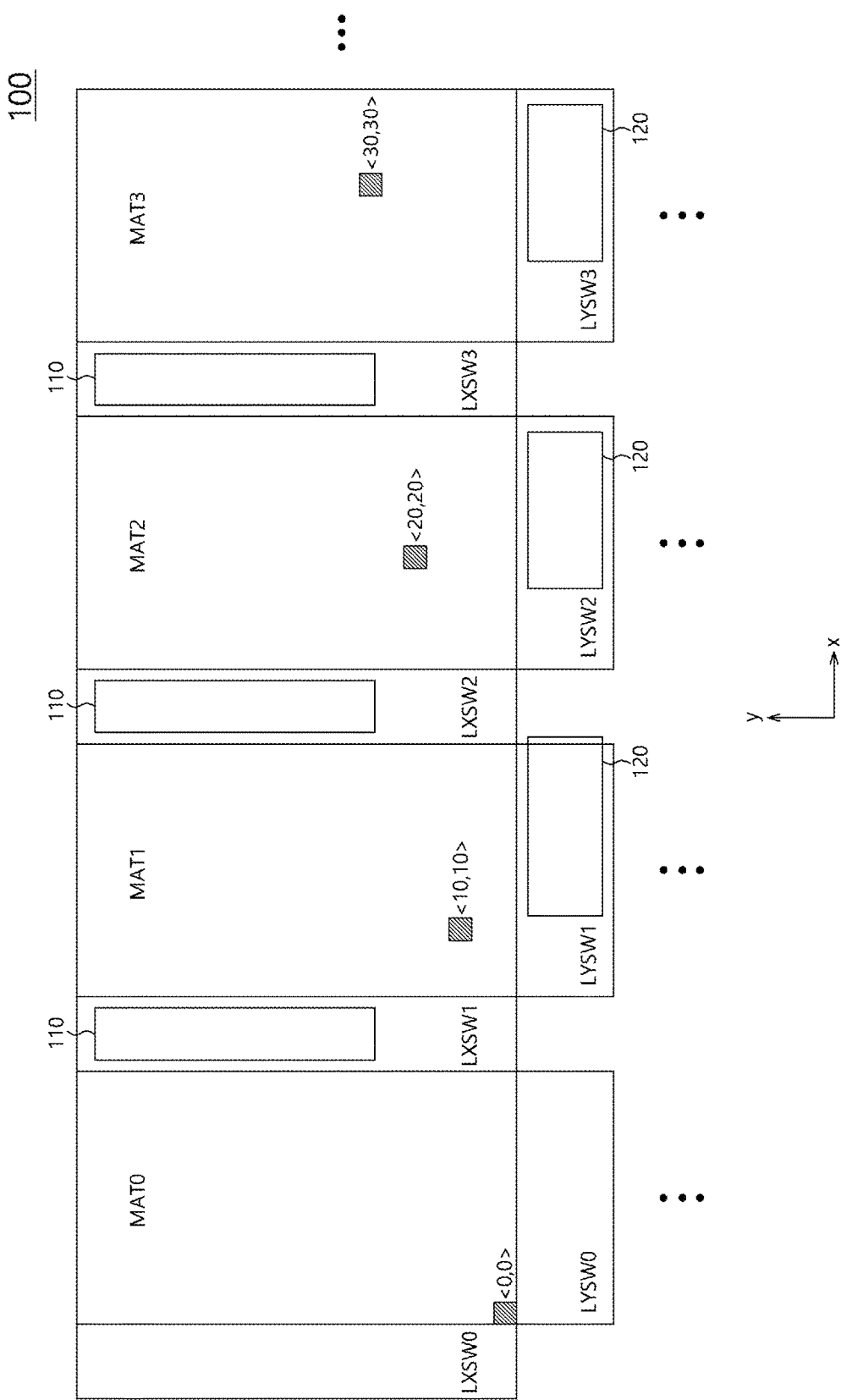
FIG. 1 is a plan view illustrating a phase change memory device in accordance with examples of embodiments.

Various examples of embodiments will be described hereinafter with reference to the accompanying drawings, in which some examples of the embodiments are illustrated. The embodiments may, however, be embodied in many different forms and should not be construed as limited to the examples of embodiments set forth herein. Rather, these examples of embodiments are provided so that this disclosure will be thorough and complete, and will fully convey a scope of the present disclosure to those skilled in the art. In the drawings, the sizes and relative sizes of layers and regions may be exaggerated for clarity.

Hereinafter, examples of the embodiments will be explained with reference to the accompanying drawings.

In an embodiment, for example, a phase change memory device may be provided that may be capable of distributing a peak current.

FIG. 1 is a plan view illustrating a phase change memory device in accordance with examples of embodiments.

Referring to FIG. 1, a phase change memory device 100 of an example of an embodiment may include a plurality of Mats MAT0, MAT1, MAT2, MAT3, etc., a plurality of row control blocks LXSW0, LXSW1, LXSW2, LXSW3, etc., and a plurality of column control blocks LYSW0, LYSW1, LYSW2, LYSW3, etc. For example, each of the Mats may include one row control block LXSW and one column control block LYSW.

The row control blocks LXSW0-LXSW3 may be configured to provide a row address (not shown) to word lines in the Mats MAT0-MAT3. The row control blocks LXSW0-LXSW3 may be arranged at first edge portions of the Mats MAT0-MAT3. The row control blocks LXSW0-LXSW3 may be electrically coupled with the word lines. Each of the rest of the row control blocks LXSW1-LXSW3 except for the row control block LXSW0 connected with a reference Mat may include a row address-changing unit 110 configured to change the row address. Further, each of the row control blocks LXSW0-LXSW3 may include a row decoder configured to receive the row address.

The column control blocks LYSW0-LYSW3 may be configured to provide a column address (not shown) to bit lines in the Mats MAT0-MAT3. The column control blocks LYSW0-LYSW3 may be arranged at second edge portions of the Mats MAT0-MAT3 along the x direction, adjacent to, and substantially perpendicular to the first edge portions. The column control blocks LYSW0-LYSW3 may be electrically connected with the bit lines. Each of the rest of the column control blocks LYSW1-LYSW3 except for the column control block LYSW0 connected with the reference Mat may include a column address-changing unit 120 configured to change the column address y-ADD. Each of the column control blocks LYSW0-LYSW3 may include a column decoder (not shown) configured to receive the column address.

FIGS. 2 to 5 are plan views illustrating a selected memory cell by each of Mats in accordance with examples of embodiments.

Referring to FIGS. 2 to 5, each of the Mats MAT0-MAT3 (See FIG. 1) may include the word lines WL0-WLn and the bit lines BL0-BLn. The word lines WL0-WLn may be intersected with the bit lines BL0-BLn. Phase change memory cells may be located at intersected points between the word lines WL0-WLn and the bit lines BL0-BLn (i.e., mc<0,0>, mc<10,10>, mc<20,20>, and mc<30,30>, etc.).

Figure 6:
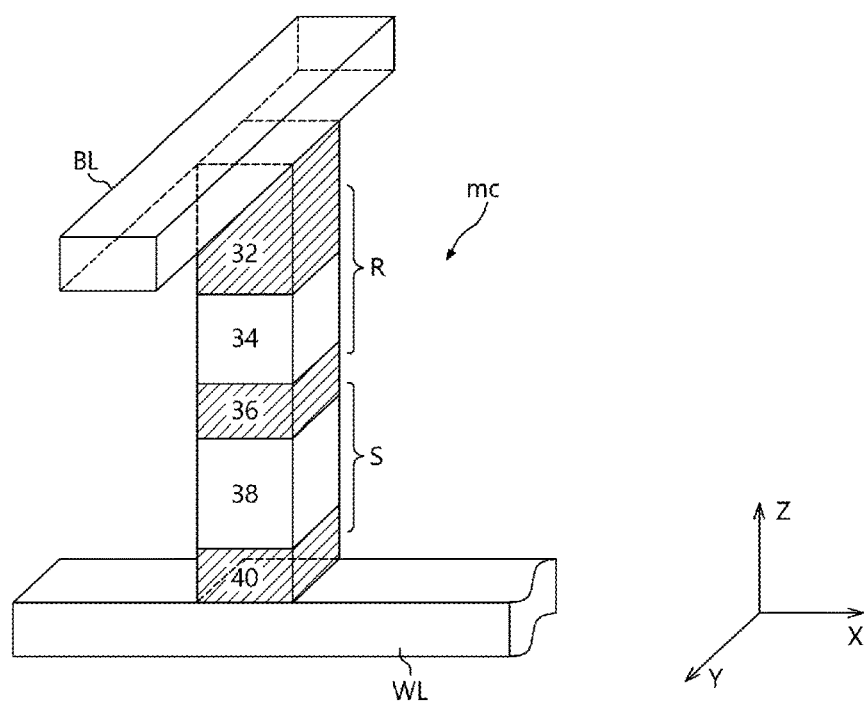
FIG. 6 is a perspective view illustrating a phase change memory cell in accordance with examples of embodiments.

FIG. 6 is a perspective view illustrating a phase change memory cell in accordance with examples of embodiments.

Referring to FIG. 6, the phase change memory cell mc may include a first electrode 32, a storage member 34, a middle electrode 36, a selector 38 and a second electrode 40. The first electrode 32 may be communicated with the bit line BL. The storage member 34 may be arranged under the first electrode 32. The middle electrode 36 may be arranged under the storage member 34. The selector 38 may be arranged under the middle electrode 36. The second electrode 40 may be arranged between the selector 38 and the word line WL.

At least one of the storage member 34 and the selector 38 may include a chalcogenide material. In an embodiment, for example, a phase change material may include a chalcogenide material which provides for resistance changes of a selector 38 or storage member 34. When the storage member 34 and the selector 38 include the chalcogenide material, the chalcogenide material of the storage member 34 may be phase-changed at a room temperature. The chalcogenide material of the selector 38 may have phase changeable characteristics different from those of the chalcogenide material in the storage member 34. The positions of the selector 38 and the storage member 34 may be reversed. In an embodiment, for example, the storage member 34 may be located between the middle electrode 36 and the second electrode 40, and the selector 38 may be located between the first electrode 32 and the middle electrode 36. In an embodiment, for example, the phase change memory cell mc including the storage member 34 electrically coupled between the selector 38 and the bit line BL may be configured to store data by implementing the resistance changes of the chalcogenide material.

The chalcogenide material of the storage member 34 may include elements in an In—Sb—Te (IST) alloy, for example, an alloy including at least two of $In_2Sb_2Te_5$, $In_1Sb_2Te_4$ and $In_1Sb_4Te_7$, elements in a Ge—Sb—Te (GST) alloy, for example, an alloy including at least two of $Ge_8Sb_5Te_8$, $Ge_2Sb_2Te_5$, $Ge_1Sb_2Te_4$, $Ge_1Sb_4Te_7$ and $Ge_4Sb_4Te_7$, etc., at least two of $In_2Sb_2Te_5$, $In_1Sb_2Te_4$ and $In_1Sb_4Te_7$, elements in a Ge—Sb—Te (GST) alloy, for example, an alloy including at least two of $Ge_8Sb_5Te_8$, $Ge_2Sb_2Te_5$, $Ge_1Sb_2Te_4$, $Ge_1Sb_4Te_7$ and $Ge_4Sb_4Te_7$, etc. The chalcogenide material of the storage member 34 may include Ge—Te, In—Se, Sb—Te, Ga—Sb, In—Sb, As—Te, Al—Te, In—Ge—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, Ge—Te—Sn—Pt, etc.

The middle electrode 36 may correspond to a node configured to electrically connect the storage member 34 with the selector 38. The middle electrode 36 may be used as a heating electrode for heating the storage member 34. The first electrode 32 may include an upper electrode or a contact portion.

The selector 38 may include an OTS material in an OTS unit. The OTS material may include any one of the chalcogenide alloy used for the storage member 34. The selector 38 may further include an element for suppressing a crystallization such as As. The element such as As may prohibit formations and or growth of nucleus in the alloy to suppress the crystallization. Thus, when a voltage of no less than a critical voltage may be applied to the selector 38, the selector 38 may be switched into a conductive state. A sufficient holding current may be provided to the selector 38 during the conductive state. The selector 38 may include Te—As—Ge—Si, Ge—Te—Pb, Ge—Se—Te, Al—As—Te, Se—As—Ge—C, Se—Te—Ge—Si, Ge—Sb—Te—Se, Ge—Bi—Te—Se, Ge—As—Sb—Se, Ge—As—Bi—Te, Ge—As—Bi—Se, etc. The second electrode 40 may be connected with the word line WL. The second electrode 40 may be used as a heating electrode for the phase change of the selector 38.

The first electrode 32, the storage member 34 and the middle electrode 36 may correspond to a phase changeable memory resistance 'R' of the phase changeable memory cell mc. The middle electrode 36, the selector 38 and the second electrode 40 may form an access element 'S' of the phase changeable memory cell mc.

Generally, in a phase change memory device including the Mats MAT0-MAT3, when the Mats MAT0-MAT3 are driven, memory cells having a same address may be simultaneously driven.

However, an excessive read and write (read/write) current may be applied to the phase change memory cell mc<0:0> nearest to the row control block LXSW and the column control block LYSW compared to other phase change memory cells. When the excessive read/write current is simultaneously applied to the phase change memory cells mc<0:0> of the Mats MAT0-MAT3, the Mats MAT0-MAT3 may malfunction.

In examples of embodiments, the rest of the row control blocks LXSW1-LXSW3 and the column control blocks LYSW1-LYSW3 among the row and column control blocks except for the row control block LXSW0 and the column control block LYSW0 configured to control the reference Mat MAT0 may include address-changing units 110 and 120 for changing address commands to designate different addresses to the Mats in response to the address commands provided from a controller.

Figure 2:
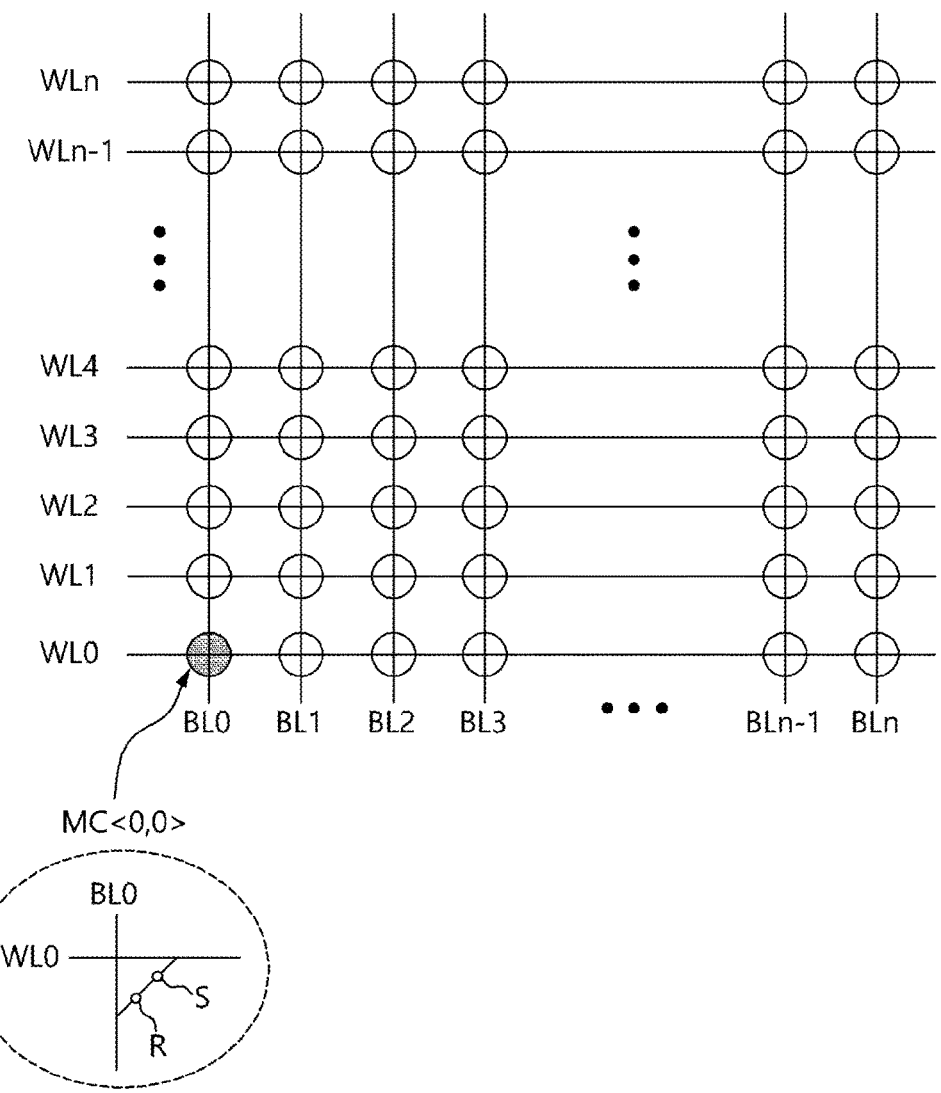
FIGS. 2 to 5 are plan views illustrating a selected memory cell by each of Mats in accordance with examples of embodiments.

For example, when an address command for selecting the phase change memory cell mc<0:0> at the intersected point between the word line WL0 and the bit line BL0 is applied, the reference Mat MAT0 may select the phase change memory cell mc<0:0> as illustrated in FIG. 2 (i.e., shaded area).

However, as illustrated in FIG. 1, the rest of the Mats MAT1-MAT3 may set the different addresses as the phase change memory cell mc<0:0> by the address-changing units 110 and 120 in the row control blocks LXW1-LXSW3 and the column control blocks LYSW1-LYSW3.

Figure 3:
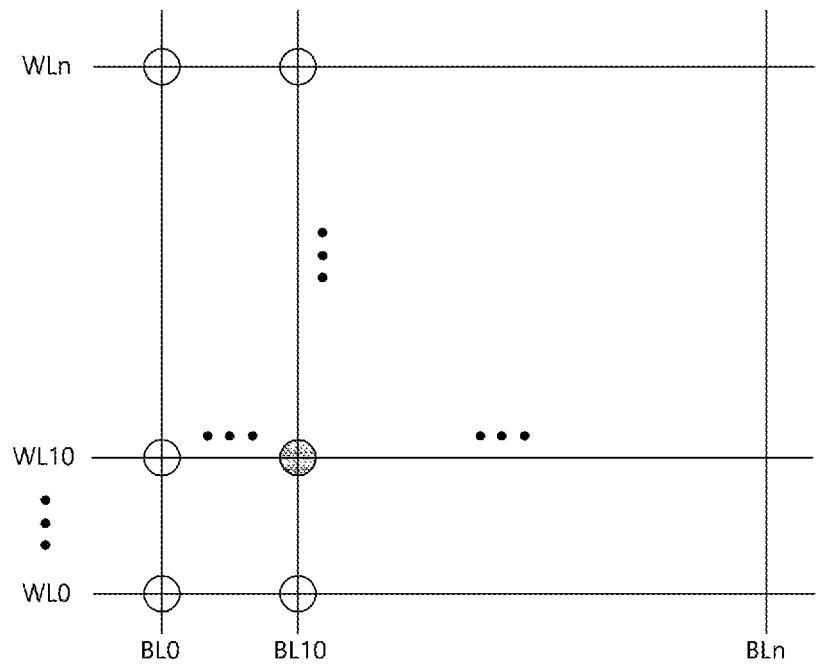

For example, as illustrated in FIG. 3, the row address-changing unit 110 and the column address-changing unit 120 in the first Mat MAT1 may change the addresses x-ADD and y-ADD to select the tenth memory cell mc<10:10> at the intersected point between the tenth word line and the tenth bit line.

Figure 4:
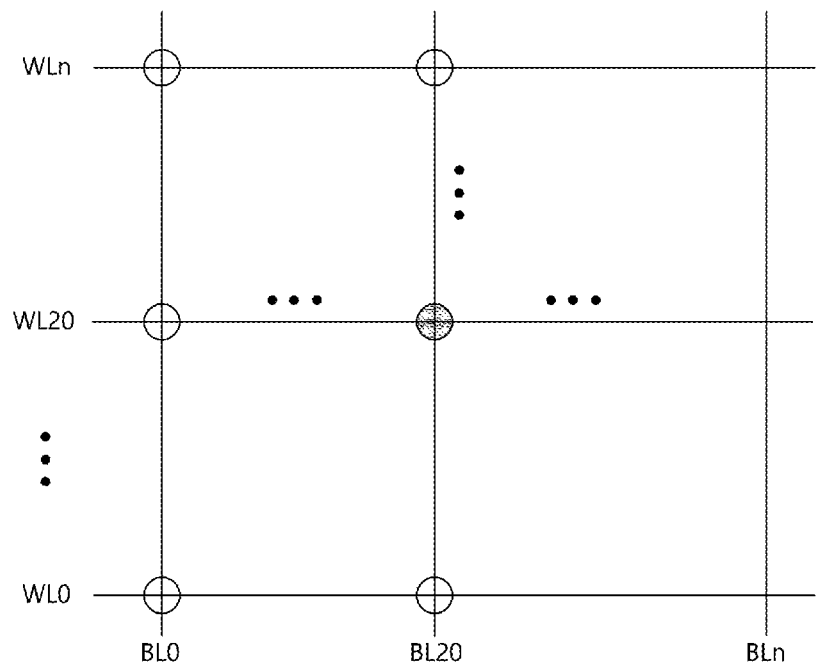

For example, as illustrated in FIG. 4, the row address-changing unit 110 and the column address-changing unit 120 in the second Mat MAT2 may change the addresses x-ADD and y-ADD to select the twentieth memory cell mc<20:20> at the intersected point between the twentieth word line and the twentieth bit line.

Figure 5:
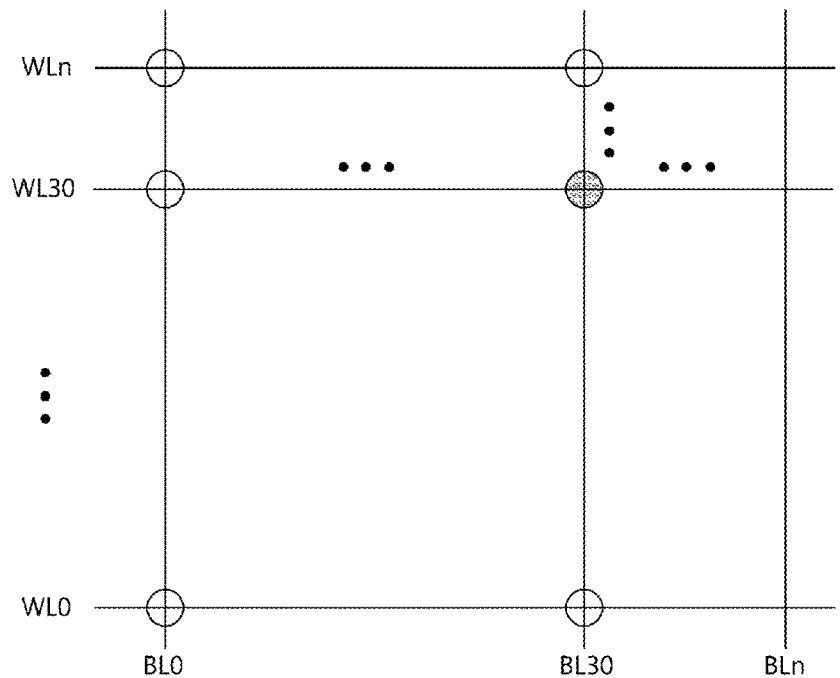

For example, as illustrated in FIG. 5, the row address-changing unit 110 and the column address-changing unit 120 in the third Mat MAT3 may change, in particular the address bits of the addresses x-ADD and v-ADD to select the thirtieth memory cell mc<30:30> at the intersected point between the thirtieth word line and the thirtieth bit line.

Figure 7:
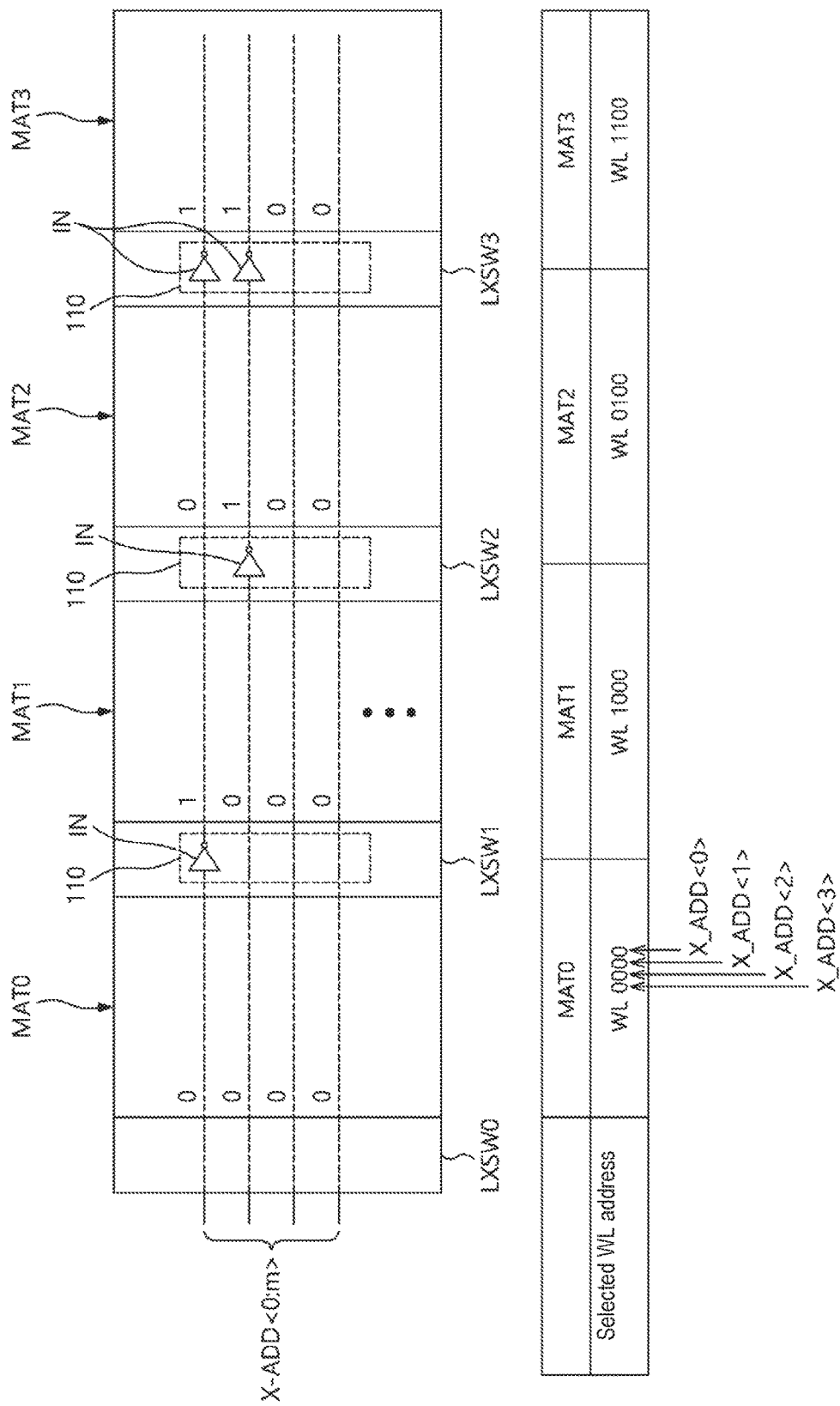
FIG. 7 is a plan view illustrating a row address-changing unit of a phase change memory device in accordance with examples of embodiments.
Figure 8:
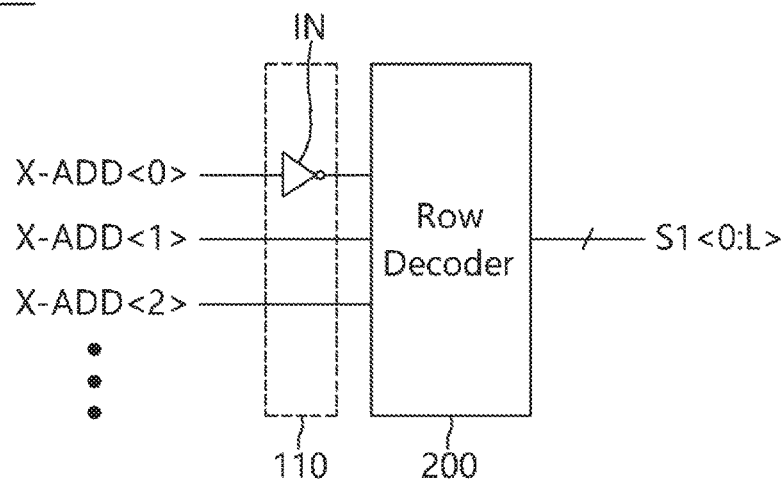
FIG. 8 is a block diagram illustrating a row control block of a phase change memory device in accordance with examples of embodiments.
Figure 9:
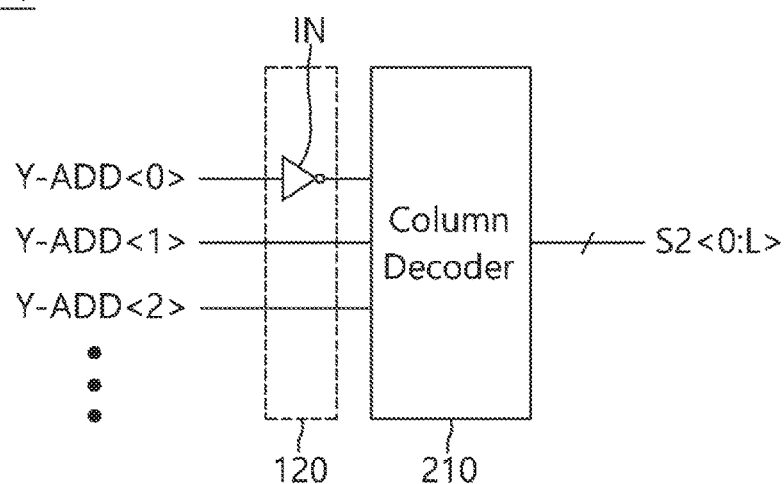
FIG. 9 is a block diagram illustrating a column control block of a phase change memory device in accordance with examples of embodiments.

FIG. 7 is a plan view illustrating a row address-changing unit of a phase change memory device in accordance with examples of embodiments, FIG. 8 is a block diagram illustrating a row control block of a phase change memory device in accordance with examples of embodiments, and FIG. 9 is a block diagram illustrating a column control block of a phase change memory device in accordance with examples of embodiments.

Referring to FIGS. 7 to 9, the row address-changing unit 110 may include at least one inverter 'IN' in configured to invert(or change) at least one of address bit of a selection address among addresses inputted into the row control block LXSW.

For example, the first row control block LXSW1 configured to control the first Mat MAT 1 may include the row address-changing unit 110 and a row decoder 200. Although not depicted in some of the drawings, all of the row control blocks LXSW0-LXSW3 may include the row decoder 200.

A row address x-ADD<0:m> may be inputted into the row address-changing unit 110. The row address-changing unit 110 for changing the address bits of the row address may include at least one inversion operator, for example but not limited to, an inverter. For example, the row address-changing unit 110 of the first Mat MAT1 is configured to change the address bit of the row address for selecting the tenth word line WL instead of the zeroth word line WL0.

For example, the row address-changing unit 110 of the first Mat MAT1 is configured to change the address bit of the row address so as to enable (or select) the tenth word line WL of the first Mat MAT1 instead of the zeroth word line WL0. In other words, if a word line corresponding to an address <0000> is enabled in the reference Mat MAT 0 according to a row address X ADD <0:m> (for example, m is 3 in the embodiment), the row address-changing unit 110 of the first Mat MAT1 may generate a word line selection signal S1<0:L> for selecting a word line corresponding to an address <1000> in the first Mat MAT 1 by an operating of the inverter IN of the row address-changing unit 110.

In examples of embodiments, numbers and connection positions of the inverter in the row address-changing unit 110 may vary in accordance with a position of a selected memory cell.

The above-mentioned process may be applied to the column control blocks LYSW as well as the row control blocks LXSW as illustrated in FIG. 9.

Each of the column control blocks LYSW0-LYSW3 may include a column decoder. For example, the first column control block LYSW1 may include the column decoder 210. A column address-changing unit 120 for selectively changing the column address y-ADD may be positioned at an input terminal of the column decoder 210. The column address-changing unit 120 may include at least one inversion operator, for example but not limited to, an inverter configured to reverse (or change) an address bit of a selected column address y-ADD<0:m>. A reference numeral S2<0:L> may indicate a bit line selection signal for enabling, for example but not limited to, a tenth bit line BL10. In an embodiment, for example, a column address-changing unit 120 may be connected to an input terminal of the column decoder 210. In an embodiment, for example, a row address-changing unit 110 may be connected to an input terminal of the row decoder 200.

According to examples of embodiments, the address-changing unit configured to change the row and column addresses may be provided to the row control block and the column control block in each of the Mats except for the row control block and the column control block in the reference Mat. Therefore, the near cell of the reference Mat adjacent to the row control block and the column control block may be selected, and the Mats except for the reference Mat may set the memory cells located at different positions to the position of the near cell. As a result, the transient current may not be concentrated on the memory cell. In an embodiment, for example, referring to FIG. 1, the near cell (i.e., phase change memory cell mc<0,0>) of the reference Mat (i.e., MAT0) adjacent the row control block (i.e., LXSW0) and the column control block (i.e., LYSW0) may be selected, and the Mats (i.e., MAT1-MAT3) except for the reference Mat (i.e., MAT0) may set the memory cells (i.e., mc<10,10>, mc<20,20>, and mc<30,30>) located at different positions to the position of the near cell (i.e., mc<0,0>). However, the embodiments are not limited in this manner and a near cell may be located at positions other than, for example, mc<0,0> and the different positions may be deemed adjacent to the row control block or column control block based on a predetermination. Additionally, the embodiments are not limited to the examples set forth above in that the memory cells may be set and located at different positions different from those described above (i.e., mc<10, 10>, mc<20,20>, and mc<30,30>) while still being spaced apart from the location of the near cell for the memory cells respective Mat.

Figure 10:
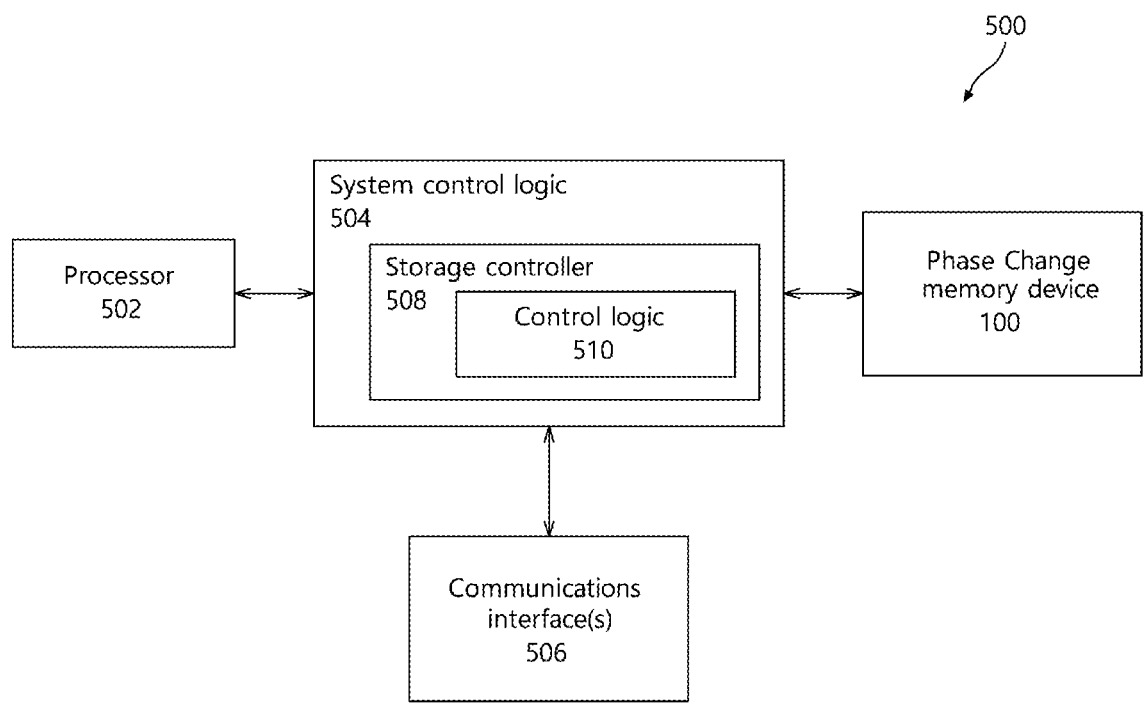
FIG. 10 is a block diagram illustrating a system in accordance with examples of embodiments.

FIG. 10 is a block diagram illustrating a system in accordance with examples of embodiments.

Referring to FIG. 10, a system 500 may include a system control logic 504, a phase change memory device or the semiconductor integrated circuit device 100 and at least one communication interface 506. The system control logic 504 may be connected with at least one of processors 502. The semiconductor integrated circuit device 100 may be connected with the system control logic 504. The communication interface 506 may be connected with the system control logic 504.

The communication interface 506 may provide an interface for the system 500 configured to communicate with devices through at least one network. The communication interface 506 may include hardware and/or firmware. In examples of embodiments, the communication interface 506 may include a network adaptor, a wireless network adaptor, a telephone modem, and/or a wireless modem. The communication interface 506 may use at least one antenna for wireless communication.

At least one of the processors 502 may be packed with a logic for at least one controller of the system control logic 504. In examples of embodiments, the processor 502 may be packed with the logic for the controller of the system control logic 504 to form a system in package (SIP).

In examples of embodiments, at least one of the processors 502 may be arranged on a die in which the logic for the controller of the system control logic may be installed.

In examples of embodiments, at least one of the processors 502 may be arranged on the die in which the logic for the controller of the system control logic may be installed to form a system on chip (SOC).

In examples of embodiments, the system control logic 504 may include interface controllers configured to provide a device or a component communicating with at least one of the processors 502 and/or the system control logic 504 through interfaces.

In examples of embodiments, the system control logic 504 may include a storage controller 508 configured to provide the semiconductor integrated circuit device 100 with interfaces for controlling various access operations such as a set operation, a reset operation, a read operation, etc. The storage controller 508 may include a control logic 510 configured to control the semiconductor integrated circuit device 100. The control logic 510 may additionally generate various selection signals for controlling drivers, level shifters, global selectors, etc. When the control logic 510 is operated by at least one of the processors 502, the control logic 510 may include commands stored in a computer readable medium for performing the above-mentioned operations of the storage controller 508.

In examples of embodiments, the system 500 may include a desktop computing device, laptop computing device, a mobile computing device such as a smart phone, a tablet, etc. The system 500 may further include components and/or different architectures.

The above embodiments of the present disclosure are illustrative and not limitative. Various alternatives and equivalents are possible. The examples of the embodiments are not limited by the embodiments described herein. Nor is the present disclosure limited to any specific type of semiconductor device. Other additions, subtractions, or modifications are obvious in view of the present disclosure and are intended to fall within the scope of the appended claims.

What is claimed is:

1. A phase change memory device comprising:
a plurality of Mats including a plurality of word lines, a plurality of bit lines and phase change memory cells positioned at intersected points between the word lines and the bit lines, the phase change memory cells including a phase change material as a selector;
a row control block included in each of the Mats and configured to control the word lines; and
a column control block included in each of the Mats and configured to control the bit lines,
wherein,
the Mats except for a reference Mat are configured to select the phase change memory cells located at different positions, which are spaced apart with respect to a position of a near cell in the reference Mat, when the near cell is selected, wherein the position of the near cell is located adjacent to the row control block and the column control block.

2. The phase change memory device of claim 1, wherein the row control block in each Mat except for the reference Mat comprises a row address-changing unit configured to change at least one address bit among the address bits of a row address for a selected word line among the word lines.

3. The phase change memory device of claim 2, wherein the row address-changing unit comprises at least one inverter.

4. The phase change memory device of claim 2, wherein the row control block further comprises a row decoder for decoding the row address to generate a word line selection signal, and a changed row address is inputted into the row decoder.

5. The phase change memory device of claim 1, wherein the column control block in each Mat except for the reference Mat comprises a column address-changing unit configured to change at least one address bit among the address bits of a column address for a selected bit line among the bit lines.

6. The phase change memory device of claim 5, wherein the column address-changing unit comprises at least one inverter.

7. The phase change memory device of claim 5, wherein the column control block in further comprises a column decoder for decoding the column address to generate a bit line selection signal, and a changed column address is inputted into the column decoder.

8. The phase change memory device of claim 1, wherein the phase change memory cell further comprises:
a storage member electrically coupled between the selector and the bit line,
wherein the storage member includes a chalcogenide material, and the storage member is configured to store data in accordance with the resistance changes of the chalcogenide material,
wherein the selector includes another chalcogenide material, as the phase change material, the selector is coupled with each of the word lines and is configured to be switched into a conductive state in accordance with the resistance changes of the chalcogenide material thereof.

9. The phase change memory device of claim 8, wherein the chalcogenide material of the selector has phase changeable characteristics different from the chalcogenide material of the storage member.

10. A phase change memory device comprising: a plurality of Mats including a plurality of word lines, a plurality of bit lines and phase change memory cells positioned at intersected points between the word lines and the bit lines, the phase change memory cells including a selector and a storage member, and the selector and the storage member including a phase change material, respectively;
  a row control block provided to each of the Mats, the row control block including a row decoder configured to receive a row address to control the word lines;
  a column control block provided to each of the Mats, the column control block including a column decoder configured to receive a column address to control the bit lines; and
  an address-changing unit provided in the row control block and the column control block in the Mats except for a reference Mat to change address bits of the received row and column addresses such that the Mats except for the reference Mat are configured to select the phase change memory cells located at different positions, which are spaced apart with resect to a position of a near cell in the reference Mat, when the near cell is selected, wherein the position of the near cell is located adjacent to the row control block and the column control block.

11. The phase change memory device of claim 10, wherein the address-changing unit comprises:
  a row address-changing unit connected to an input terminal of the row decoder; and
  a column address-changing unit connected to an input terminal of the column decoder.

12. The phase change memory device of claim 11, wherein the row and column address-changing units comprise at least one inverter.

* * * * *